United States Patent [19]

Suzuki

[11] Patent Number: 5,656,516
[45] Date of Patent: Aug. 12, 1997

[54] METHOD FOR FORMING SILICON OXIDE LAYER

[75] Inventor: Atsushi Suzuki, Kanagawa, Japan

[73] Assignee: Sony Corporation, Tokyo, Japan

[21] Appl. No.: 456,917

[22] Filed: Jun. 1, 1995

[30] Foreign Application Priority Data

Jun. 3, 1994 [JP] Japan ................. 6-145500

[51] Int. Cl.⁶ ......................................... H01L 21/316
[52] U.S. Cl. ......................................................... 437/773
[58] Field of Search ...................................... 437/239, 242, 437/406 S

[56] References Cited

U.S. PATENT DOCUMENTS

| | | | |
|---|---|---|---|
| 4,438,157 | 3/1984 | Romano-Moran | 427/93 |
| 5,210,056 | 5/1993 | Pong et al. | 437/239 |
| 5,225,355 | 7/1993 | Sugino et al. | 437/10 |
| 5,244,843 | 9/1993 | Chau et al. | 437/239 |
| 5,254,506 | 10/1993 | Hori | 437/241 |
| 5,290,718 | 3/1994 | Fearon et al. | 437/34 |
| 5,296,411 | 3/1994 | Gardner et al. | 437/238 |
| 5,382,533 | 1/1995 | Ahmad et al. | 437/24 |
| 5,393,686 | 2/1995 | Yeh et al. | 437/45 |
| 5,434,102 | 7/1995 | Watanabe et al. | 437/130 |
| 5,506,178 | 4/1996 | Suzuki et al. | 437/239 |

FOREIGN PATENT DOCUMENTS

| | | | |
|---|---|---|---|
| 1696625 | 1/1972 | Germany | C23C 11/14 |
| 54-021264 | 7/1977 | Japan | H01L 21/31 |
| 61-172339 | 8/1986 | Japan | H01L 21/314 |

Primary Examiner—Charles L. Bowers, Jr.
Assistant Examiner—Matthew Whipple
Attorney, Agent, or Firm—Hill, Steadman & Simpson

[57] ABSTRACT

A process for forming a silicon oxide film having excellent TZDB and TDDB characteristics and reduced in defects, the process comprising forming a silicon oxide film on a semiconductor substrate by means of wet oxidation; heat treating the silicon oxide film in an inert gas atmosphere containing a halogen element; and nitriding the resulting silicon oxide film. Preferably, nitriding is effected in a gaseous $N_2O$ atmosphere. Otherwise, heat treatment in a gaseous $N_2O$ atmosphere may be performed after nitriding the silicon oxide film in a gaseous $NH_3$ atmosphere.

4 Claims, 6 Drawing Sheets

(Evaluation of Time-Dependent Dielectric Breakdown)

(Evaluation of Time-Zero Dielectric Breakdown)

METHOD FOR FORMING SILICON OXIDE LAYER

BACKGROUND OF THE INVENTION

1. Field of the Invention

The present invention relates to a method for forming a silicon oxide film ($SiO_2$ film) on a semiconductor substrate, and to an oxide film for use in a semiconductor device, said oxide film comprising the silicon oxide film formed by said method.

2. Description of the Related Art

In the fabrication of an MOS semiconductor device, it is requisite to form an oxide film on a semiconductor substrate to provide a gate dielectric. The characteristics of a gate dielectric are greatly influenced by the atmospheric condition under which the oxide film is formed. For instance, an oxide film comprising a silicon oxide film can be formed by dry oxidation method or wet oxidation method. The dry oxidation method comprises forming a silicon oxide film on the surface of a silicon semiconductor substrate by supplying a sufficiently dried high purity gaseous oxygen to a heated silicon semiconductor substrate. The wet oxidation method comprises forming a silicon oxide film on the surface of a silicon semiconductor substrate by supplying a high-temperature carrier gas containing water vapor to the silicon semiconductor substrate.

Pyrogenic oxidation method is a type of wet oxidation method. The pyrogenic oxidation method is highly reproducible, and it can be effected without controlling the water flow. The method comprises preparing water by combusting pure hydrogen. As compared with an oxide film formed by dry oxidation, a silicon oxide film prepared by pyrogenic oxidation is inferior in resistance against hot carriers due to the large population of electron traps attributed to water, however, is superior in dielectric breakdown characteristics and long-term reliability.

Particularly, in case a silicon oxide film is fabricated by dry oxidation in an oxidizing atmosphere comprising, for example, a compound containing a halogen element such as chlorine, e.g., HCl, $Cl_2$, $CCl_4$, $C_2HCl_3$, $CH_2Cl_2$, or $C_2H_3Cl_3$, the following advantages are obtained:

(A) neutralization or gettering of alkali metal impurities can be effected inside the silicon oxide film;
(B) layer stacking defects can be reduced;
(C) time-zero dielectric breakdown (sometimes referred to simply hereinafter as "TZDB") characteristics, which is an index in the short-term evaluation of dielectric breakdown, can be improved; and
(D) an improved channel mobility can be obtained.

The dry oxidation method above using a halogen-containing atmosphere is referred to hereinafter as a "hydrochloric acid oxidation method".

On the other hand, by subjecting a silicon oxide film already formed on a substrate to a heat treatment in an inert gas atmosphere such as gaseous nitrogen or argon at a temperature in a range of from 800° to 1,000° C. for a duration of about 30 minutes, it is known that an interface improved in the following points is formed between a silicon semiconductor substrate and a silicon oxide film thereon:
(E) fixed charge is decreased; and
(F) density of states are reduced.

The long-term reliability of a silicon oxide film can be evaluated by using time dependent dielectric breakdown (sometimes referred to simply hereinafter as "TDDB") characteristics as an index. The TDDB characteristics refer to a dielectric breakdown which is observed to occur after a passage of time, but not instantaneously upon applying a current stress or a voltage stress. In general, TDDB includes a region of random failure in which some of the semiconductor devices intermittently undergo breakdown, and a region of intrinsic breakdown (wear region) in which breakdown occurs rapidly on all of the semiconductor devices. Because the generation of an initial breakdown causes failure of the semiconductor devices that are put into market, it is requisite to reduce the generation of random failure to a level as low as possible. In contrast to the above, the intrinsic breakdown occurs due to the intrinsic breakdown of the silicon oxide film. Accordingly, intrinsic breakdown represents the allowable capacity limit of a silicon oxide film.

Considering the TDDB characteristics, a silicon oxide film fabricated by wet oxidation is superior to a one fabricated by dry oxidation. In other words, a silicon oxide film fabricated by wet oxidation exhibits superior long-term reliability. It is believed that —OH and —$SiOH_x$ groups in the silicon oxide film contribute to the amelioration of the TDDB characteristics.

The use of hydrochloric acid oxidation, which is a kind of dry oxidation method for the fabrication of the silicon oxide film, surely contributes to the amelioration of the TZDB characteristics to a certain extent, however, there still remains a problem that it cannot provide a film improved in TDDB characteristics. Furthermore, the process requires a difficult and complicated control of the equipments and the film deposition conditions.

As mentioned in the foregoing, the silicon oxide film fabricated by wet oxidation yields excellent TDDB characteristics. Improvements can be observed on the aforementioned fixed charges (E) and density of states (F) by further subjecting the resulting film to heat treatment in an atmosphere of an inert gas such as nitrogen or argon, however, the TZDB characteristics result lower than those obtained on a film fabricated by hydrochloric acid oxidation process.

A process for forming an insulating film is disclosed in, for example, JP-A-3-219632 (the term "JP-A-" as referred herein signifies an "unexamined published Japanese patent application"). This process comprises depositing an insulating film and then heat treating the resulting film under a reactive gas atmosphere, for instance, a gaseous atmosphere containing chlorine. According to the disclosed process, the insulating film is formed by rapid heating using an infrared-emitting lamp. That is, the insulating film is formed by a so-called dry oxidation. Thus, the TDDB characteristics of the resulting film are inferior to those of a silicon oxide film obtained by wet oxidation. Furthermore, the object of the disclosed process is to reduce the film defects attributed to dangling bonds and the like that are formed in the insulating film. In other words, the process described above does not aim to improve the TZDB and the TDDB characteristics of the film. The disclosed process further comprises forming an $SiCl_x$-based doping layer in the vicinity of the insulating film and the substrate by performing heat treatment at 1,000° X for a duration of 20 seconds to effect the so-called RTA (rapid thermal annealing).

As described in the foregoing, both of the conventional dry oxidation and wet oxidation methods fail to provide a silicon oxide film capable of achieving satisfactory characteristics concerning TZDB and TDDB.

With respect to a flash memory, which is a promising device believed to replace magnetic disks in the future, charge is injected or discharged through a floating gate to write or erase data. Although there are various methods for charge injection proposed to present, generally known are a channel hot electron injection method and a method of taking advantage of Fowler-Nordheim tunneling by applying a high electric field (e.g., 8 MV/cm or higher) to the tunnel oxide film. However, if traps should be present in the tunnel oxide film of flash memories, the charge would be trapped in the levels upon writing and/or erasing data. This causes fluctuation in the threshold voltage of the transistors constituting the flash memory, and leads to the malfunction of the flash memory. Thus, it is keenly demanded to obtain a modified tunnel oxide film, so that the trapping of charges might be suppressed upon writing and/or erasing data.

In the light of the aforementioned circumstances, the present inventors have proposed a method for forming a silicon oxide film which satisfies both of the required TZDB and TDDB characteristics in Japanese patent application Hei-6-86836 (filed on Mar. 23, 1993) and Hei 5-287494 (filed on Oct. 26, 1993). The methods for forming silicon oxide film above are certainly effective; yet, an improved method must be developed to implement a silicon oxide film having a still higher quality.

SUMMARY OF THE INVENTION

An object of the present invention is to provide a method for forming a silicon oxide film reduced in defects and thereby improved in both of the time-zero dielectric breakdown (TZDB) characteristics and the time dependent dielectric breakdown (TDDB) characteristics.

Another object of the present invention is to provide an oxide film (e.g., a gate dielectric and a tunnel oxide film) for a transistor according to the process for forming the silicon oxide film above.

The aforementioned objects can be accomplished by a process for forming a silicon oxide film according to the present invention, which comprises forming a silicon oxide film on a semiconductor substrate by wet oxidation method, heat-treating the resulting silicon oxide film in an inert gas atmosphere containing a halogen element, and then nitriding the silicon oxide film.

According to the process for forming a silicon oxide film of the present invention, a pyrogenic oxidation method is preferably selected among the various types of wet oxidation methods. Halogen elements for use in the present invention include chlorine, bromine, and fluorine, but preferred among them is chlorine. The halogen element can be incorporated in the inert gas in the form of a compound, such as HCl, $CCl_4$, $C_2HCl_3$, $Cl_2$, HBr, or $NF_3$. The halogen element must account for 0.001 to 10% by volume of the inert gas when incorporated in the form of a molecule or a compound. Preferably, the halogen element accounts for 0.005 to 10% by volume, and more preferably, it accounts for 0.02 to 10% by volume of the inert gas. In case of using a gaseous hydrogen chloride, for instance, the inert gas preferably contains gaseous hydrogen chloride for a concentration of from 0.02 to 10% by volume.

The heat treatment of the silicon oxide film in an inert gas atmosphere containing a halogen element is preferably effected by furnace annealing. The heat treatment is effected at a temperature in a range of from 700° to 1,200° C., preferably in a range of from 700° to 1,000° C., and more preferably, in a range of from 700° to 950° C., and for a duration of from 5 to 60 minutes, preferably for 10 to 40 minutes, and more preferably, for 20 to 30 minutes. Inert gases for use in the treatment include gaseous nitrogen and gaseous argon.

Nitriding is preferably effected in gaseous nitrous oxide, gaseous nitrogen monoxide, or gaseous nitrogen dioxide, however, particularly preferred is to perform the treatment in gaseous nitrous oxide. Otherwise, nitriding can be effected in gaseous $NH_3$, gaseous $N_2H_4$, or a gaseous hydrazine derivative, followed by heat treatment in gaseous $N_2O$ or $O_2$. In such a case, nitriding is performed at a temperature in a range of from 700° to 1,200° C., preferably in a range of from 800° to 1,150° C., and more preferably, at a temperature in a range of from 900° to 1,100° C. It is preferred to heat the semiconductor substrate during the nitriding by irradiating an infrared radiation or by performing furnace annealing.

The semiconductor substrate for use in the method of the present invention not only refers to the substrate itself such as silicon semiconductor substrate, but also to a base on which a silicon oxide film is to be formed; for instance, a substrate provided thereon an epitaxially grown layer, a polycrystalline layer, or an amorphous layer, as well as a substrate or a substrate provided with the layers above and further having a semiconductor device formed thereon can be used as a substrate.

The oxide film for a semiconductor device according to the present invention, for instance, a gate dielectric and a tunnel oxide film, comprises a silicon oxide film formed by the method described above for forming a silicon oxide film according to the present invention.

The method for forming a silicon oxide film according to the present invention comprises forming the silicon oxide film by wet oxidation. Thus, as compared with a silicon oxide film fabricated by dry oxidation, the present invention provides a silicon oxide film having a lower leak, and yet, at a higher production yield. Conclusively, the present invention provides a silicon oxide film having superior time dependent dielectric breakdown (TDDB, $Q_{BD}$) characteristics.

Moreover, because the method according to the present invention comprises subjecting the silicon oxide film to a heat treatment in an inert gas atmosphere containing a halogen element, metallic impurities as well as hydroxyl groups can be removed from the silicon oxide film, or hydroxyl groups can be substituted by halogen elements. Accordingly, the TZDB characteristics of the film can be improved. It is well known that B-mode failure (a so-called breakdown mode due to weak spots) in the TZDB distribution has an intimate relation with the random failure region of TDDB (reference can be made to, for instance, Mitsumasa Koyanagi, "Sub-micrometer Devices II", in *Electronic Materials,* published by Maruzen Co., Ltd.). By subjecting the silicon oxide film to a heat treatment in an inert gas atmosphere containing a halogen element, weak spots in the silicon oxide film can be reduced to obtain a silicon oxide film having a TDDB characteristics extremely reduced in the region of random failure.

Furthermore, by nitriding the silicon oxide film, nitrogen atoms thus introduced into the silicon oxide film or into the boundary between the silicon oxide film and the semiconductor substrate terminate the dangling bonds of silicon (Si) and oxygen (O) that are believed to behave as trap centers. Thus, a still further improved reliability can be imparted to the resulting silicon oxide film. As described in the foregoing, the silicon oxide film fabricated by the method of the present invention not only exhibits superior TDDB characteristics and TZDB characteristics, but also yields a further improved reliability by effecting nitriding.

DETAILED DESCRIPTION OF THE PREFERRED EMBODIMENTS

The present invention is described in further detail referring to Examples with the attached drawings. First, as a reference, a silicon oxide film is formed by wet oxidation on a semiconductor substrate, and the resulting film is subjected to heat treatment in an inert gas atmosphere containing a halogen element. As another reference example, a silicon oxide film is heat-treated in an inert gas atmosphere containing no halogen elements. The time-zero dielectric breakdown (TZDB) characteristics as well as the time dependent dielectric breakdown (TDDB) characteristics are evaluated for comparison.

REFERENCE EXAMPLES

For a reference example, a silicon oxide film was formed on a semiconductor by wet oxidation, and the resulting silicon oxide film was subjected to heat treatment in an inert gas atmosphere containing a halogen element. No further nitriding was effected to the resulting silicon oxide film.

A silicon semiconductor substrate was provided as the semiconductor substrate in this case, and a 8 nm thick silicon oxide film was formed on the surface thereof by pyrogenic oxidation ( i.e., a type of wet oxidation) while maintaining the substrate at a temperature of 850° C. Prior to the formation of the silicon oxide film, if necessary, the surface of the semiconductor substrate is subjected to a cleaning process using chemicals or pure water, or to a heat treatment in a reducing gas atmosphere to remove natural oxide from the surface. Then, the silicon oxide film was heat-treated in an inert gas atmosphere containing a halogen element. More specifically, the silicon oxide film was heat-treated in a nitrogen gas atmosphere containing 0.1% by volume of gaseous hydrogen chloride, by maintaining the film at various temperatures in a range of from 700° to 950° C. for a constant duration of 30 minutes. A furnace apparatus was used for the heat treatment. A gate electrode was formed from a phosphorus-doped polysilicon on the resulting silicon oxide film by employing known processes of CVD, photolithography, and dry-etching. A so-called MOS capacitor was implemented in this manner.

For a reference comparative example, a silicon oxide film was formed on a semiconductor substrate in the same manner as in the reference example above, except for heat-treating the silicon oxide film in an inert gas atmosphere containing no halogen element. The same conditions as those described above were used for the pyrogenic oxidation and the heat treatment.

The results obtained through the evaluation of time-zero dielectric breakdown (TZDB) characteristics are described below.

Figure 2A:
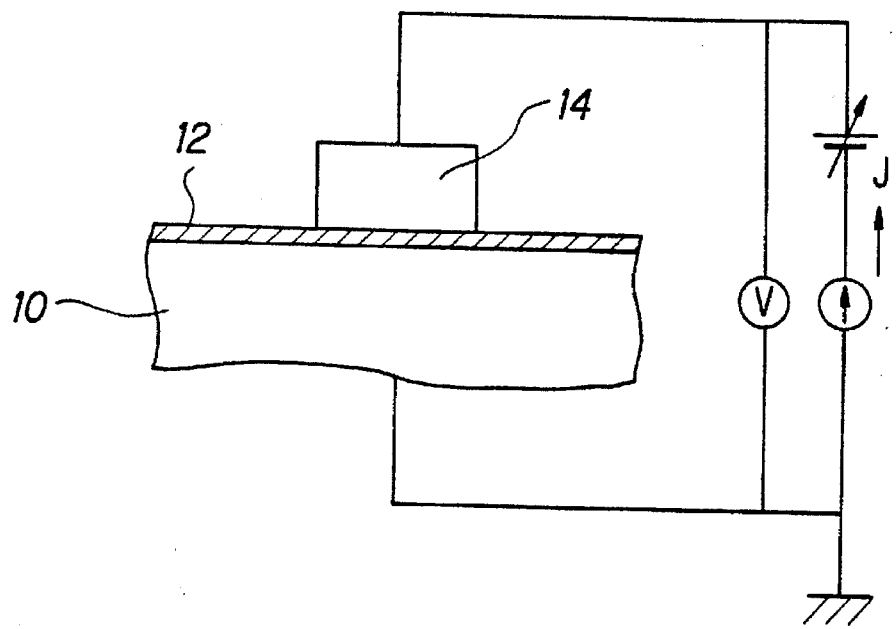
FIGS. 2A and 2B are each a schematically drawn circuit for use in the evaluation of time dependent dielectric breakdown (TDDB) characteristics and of time-zero dielectric breakdown (TZDB) characteristics.
Figure 2B:
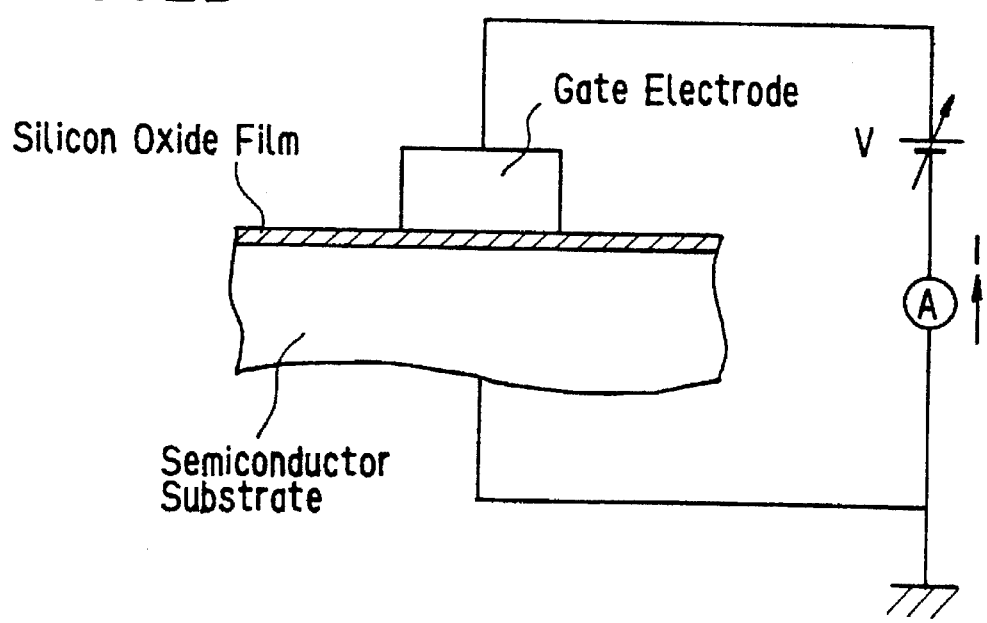

One hundred MOS capacitors were fabricated on a single semiconductor substrate. Gate electrodes were each formed on the silicon oxide film (gate dielectric) for an area of 5 mm². For evaluation, two semiconductor substrates were used for both of the reference and reference comparative examples. Referring to the schematically drawn FIG. 2B, a circuit was fabricated, and the voltage V applied to the gate electrode was increased while measuring the current I of the circuit. Upon attaining a judging current $I_J$ (equivalent to 0.1 μA), the voltage $V_J$ was measured to calculate the applied electric field from the measured value. The number of MOS capacitors whose applied electric field exceeded 8 MV/cm was obtained (i.e., the so-called C-mode accepted devices were counted), and is shown in the graph of FIG. 5 expressed in terms of percentage.

Figure 5:
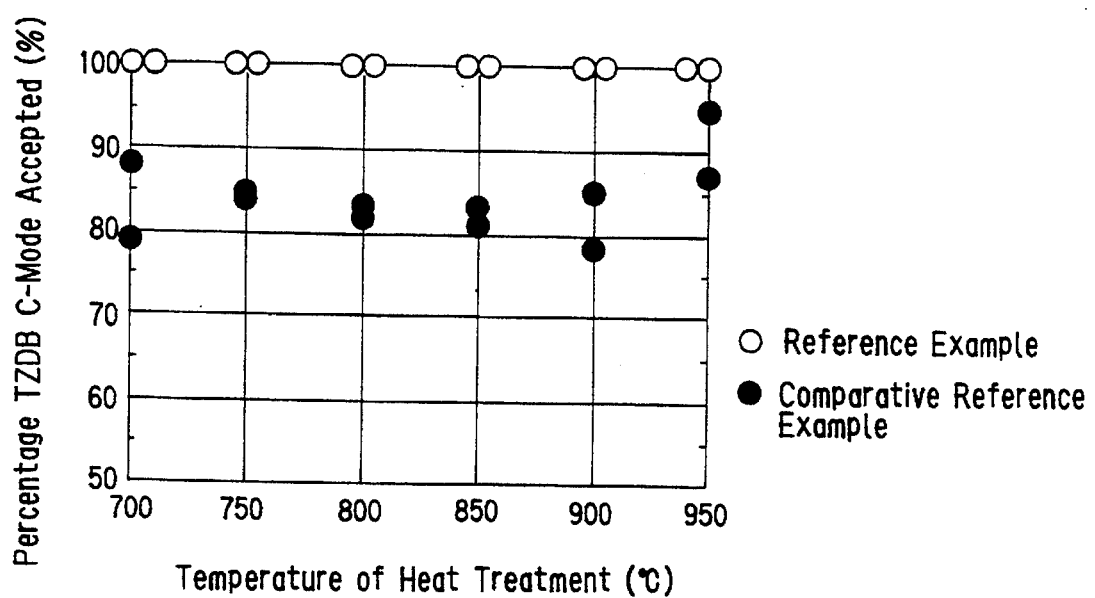
FIG. 5 is a graph showing the results obtained in the evaluation of TZDB characteristics for silicon oxide films obtained in Reference Example and Comparative Reference Example.

FIG. 5 clearly reads that all of the MOS capacitors fabricated by applying heat treatment at a temperature in a range of from 700° to 950° C. passed the C-mode specification. This is in clear contrast with the MOS capacitors obtained by a process according to the reference comparative example, in which only about 80% were C-mode acceptable.

The results obtained through the evaluation of time dependent dielectric breakdown (TDDB) characteristics are described below.

Fifty MOS capacitors were fabricated on a single semiconductor substrate. Gate electrodes were each formed on the silicon oxide film (gate dielectric) for an area of 0.1 mm². For evaluation, two semiconductor substrates were used for both of the reference and reference comparative examples. Referring to the schematically drawn FIG. 2A, a circuit was fabricated, and a constant stress current J of 0.2 A/cm² was applied to the gate electrode according to the constant current TDDB evaluation method. The total charge applied to the silicon oxide film until dielectric breakdown occurred was measured; i.e., the so-called Coulomb breakdown $Q_{BD}$ was obtained. The value $Q_{BD}$ can be expressed as a product of J (A/cm²) and the time passage $t_{BD}$ until dielectric breakdown occurred.

Figure 6A:
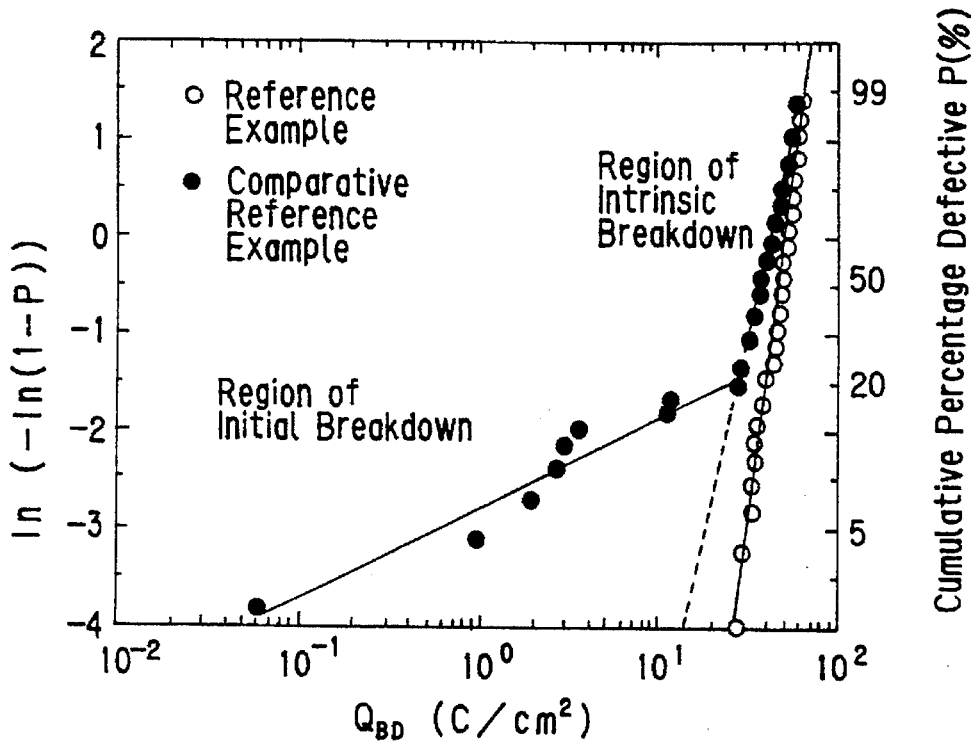
FIGS. 6A and 6B are graphs showing the results obtained in the evaluation of TDDB characteristics of silicon oxide films formed by methods described in Reference Example and Comparative Reference Example.

Referring to the graph of FIG. 6A, the relation between the cumulative failure P and $Q_{BD}$ for the capacitors obtained by a heat treatment at 900° C. is expressed by Weibull distribution.

Figure 6B:
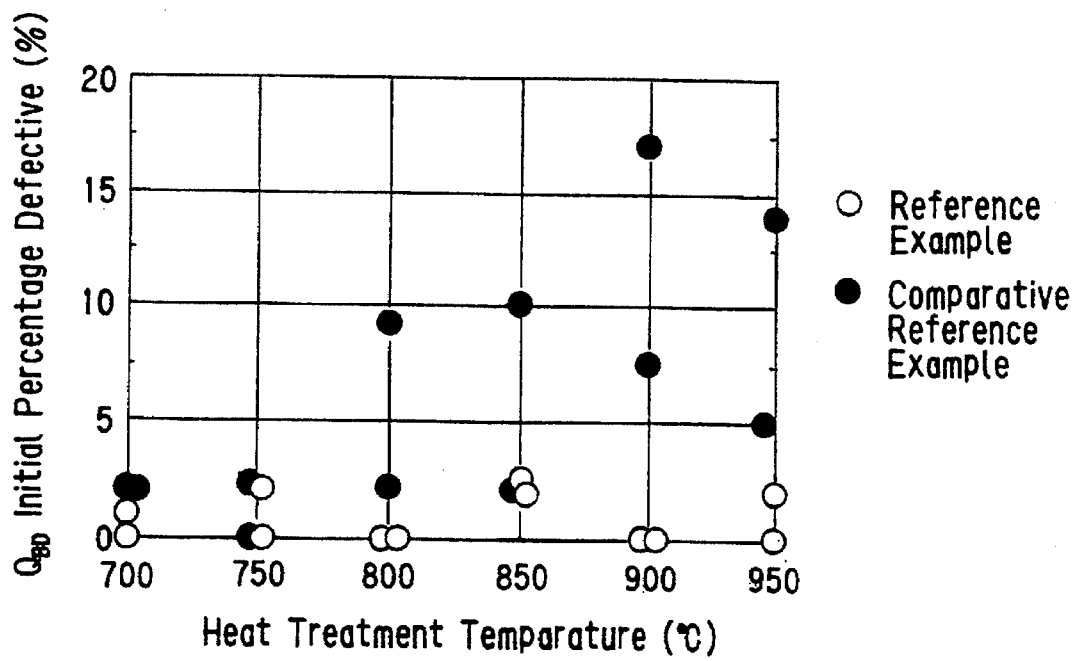

FIG. 6B shows the relation between the random failure in $Q_{BD}$ and the temperature of heat treatment. It can be clearly observed from the results above that the random failure for the capacitors obtained in a temperature range of from 700° to 950° C. according to the method of reference example is 3% or lower. However, with increasing temperature for heat treatment from 700° to 950° C., the percentage defective in the random failure region in $Q_{BD}$ for the capacitors obtained according to the reference comparative example increases to a value in the vicinity of 20%. It can be seen from the foregoing that a capacitor fabricated by first forming a silicon oxide film on a semiconductor substrate by wet oxidation and then subjecting it to heat treatment in an inert gas atmosphere containing a halogen element yields far improved TZDB characteristics and TDDB characteristics as compared with a capacitor fabricated by a process comprising heat treating the silicon oxide film in an inert gas atmosphere containing no halogen elements. Furthermore, it can be understood that the heat treatment in an inert gas atmosphere containing a halogen element is preferably effected at a temperature in a range of from 700° to 950° C.

EXAMPLE 1

An example according to an embodiment of the present invention is described below. In the process for fabricating a device according to the present invention, nitriding of the silicon film is effected after performing the steps described in the process of the reference example above.

Figure 1A:
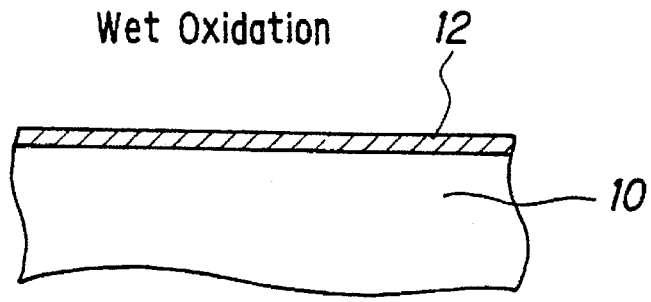
FIGS. 1A to 1D are a diagram showing schematically drawn partial cross sections of a semiconductor substrate and the like, provided as an explanatory means for describing a method for forming a silicon oxide film according to an embodiment of the present invention.

A 3 nm thick silicon oxide film 12 was formed by means of a conventional pyrogenic oxidation method (i.e., a type of wet oxidation method) on the surface of a silicon semiconductor substrate 10 provided as the semiconductor substrate in this case (FIG. 1A). Pyrogenic oxidation can be effected, for instance, while maintaining the substrate at a temperature of 750° C. If necessary, the surface of the semiconductor substrate is cleaned before the formation of the silicon oxide film by, for instance, cleaning the substrate using chemicals or pure water, or removing a natural oxide film by effecting heat treatment in a reducing gas atmosphere.

Figure 1B:
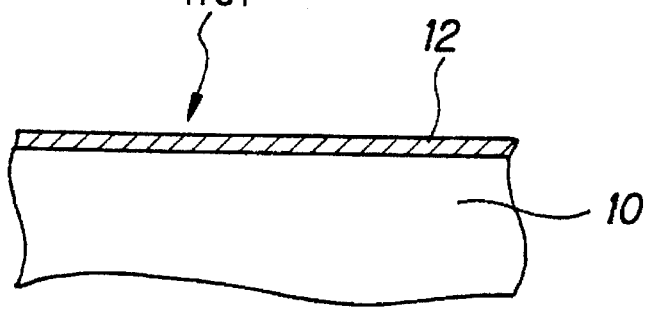

The resulting silicon oxide film was subjected to heat treatment in an inert gas atmosphere containing a halogen element (FIG. 1B). More specifically, the silicon oxide film was subjected to heat treatment by using a furnace apparatus, while maintaining the temperature at 850° C. for a duration of 30 minutes in a nitrogen gas atmosphere containing 0.1% by volume of gaseous hydrogen chloride. Assumably, a halogen element (specifically, chlorine) is introduced in this manner into the silicon oxide film to remove therefrom the metallic impurities which cause leak current.

Figure 1C:
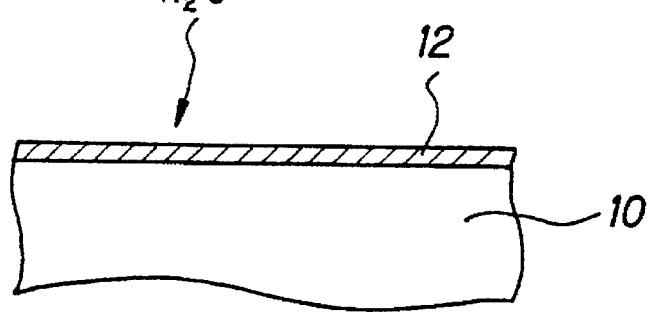

The silicon oxide film was subjected to nitriding thereafter. More specifically in this case, the silicon oxide film was nitrided in a gaseous $N_2O$ atmosphere at 1,000° C. for a duration of 20 seconds (FIG. 1C). The semiconductor substrate was heated by irradiating an infrared radiation during nitriding. The thickness of the silicon oxide film was found to increase to 4 nm by nitriding, and nitrogen atoms were introduced into the silicon oxide film or into the boundary between the silicon oxide film and the semiconductor substrate. Assumably, the nitrogen atoms thus introduced terminate the dangling bonds of silicon (Si) and oxygen (O).

Figure 1D:
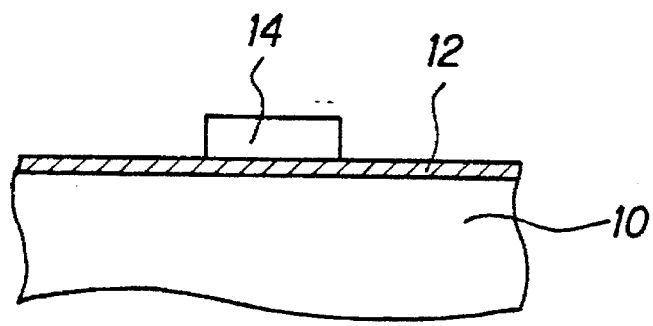

A gate electrode 14 was formed from a phosphorus-doped polysilicon on the resulting silicon oxide film by employing known processes of CVD, photolithography, and dry-etching (FIG. 1D). A so-called MOS capacitor was implemented in this manner.

EXAMPLE 2

Another example according to another embodiment of the present invention is described below. A device was fabricated in a manner similar to that described in Example 1 above, except for effecting nitriding in a gaseous $NH_3$ atmosphere, and subjecting the resulting silicon oxide film to a heat treatment in a gaseous $N_2O$ atmosphere thereafter. Thus, the step of forming a silicon oxide film on a semiconductor substrate by means of wet oxidation and the subsequent step of heat treating the silicon oxide film in an inert gas atmosphere containing a halogen element were performed in the same manner as in the process of Example 1. The nitriding treatment and the heat treatment for Example 2 are described below.

A 3 nm thick silicon oxide film formed on a semiconductor substrate by wet oxidation in a manner similar to that described in Example 1 was heat-treated in an inert gas atmosphere containing a halogen element. The resulting silicon oxide film was nitrided in gaseous $NH_3$ atmosphere at 900° C. for a duration of 60 seconds. The substrate was heated by irradiating an infrared radiation. In the nitriding using gaseous $NH_3$, nitrogen atoms as well as hydrogen atoms were introduced into the silicon oxide film. Similar to the case in Example 1, the nitrogen atoms assumably terminate the dangling bonds of silicon (Si) and oxygen (O). On the other hand, hydrogen atoms are known to behave as electron traps in a silicon oxide film. Thus, in the process of Example 2, the silicon oxide film was subjected to heat treatment in gaseous $N_2O$ after the nitriding treatment. During the heat treatment, the substrate was heated by irradiating an infrared radiation. The hydrogen atoms incorporated into the silicon oxide film can be driven out of the film in this manner. The thickness of the silicon oxide film was found to increase to 4 nm by the heat treatment, and principally nitrogen atoms were introduced into the silicon oxide film or into the boundary between the silicon oxide film and the semiconductor substrate.

A gate electrode was formed from a phosphorus-doped polysilicon on the resulting silicon oxide film by employing known processes of CVD, photolithography, and dry-etching. A so-called MOS capacitor was implemented in this manner.

COMPARATIVE EXAMPLE 1

A silicon oxide film was formed in the same manner as in the process described in Example 1, except for omitting the step of nitriding. That is, after forming a 4 nm thick silicon oxide film 12 by pyrogenic oxidation on the surface of a silicon semiconductor substrate provided as the semiconductor substrate in this case, the resulting silicon oxide film was heat treated in a nitrogen gas atmosphere containing 0.1% by volume of gaseous hydrogen chloride at 850° C. for a duration of 30 minutes. A gate electrode was formed thereafter from a phosphorus-doped polysilicon on the resulting silicon oxide film by employing known processes of CVD, photolithography, and dry-etching. A so-called MOS capacitor was implemented in this manner. Although different conditions are employed, the silicon oxide film obtained in Comparative Example 1 was formed by substantially the same method as that used in the formation of the silicon oxide film according to the reference example above.

Figure 3:
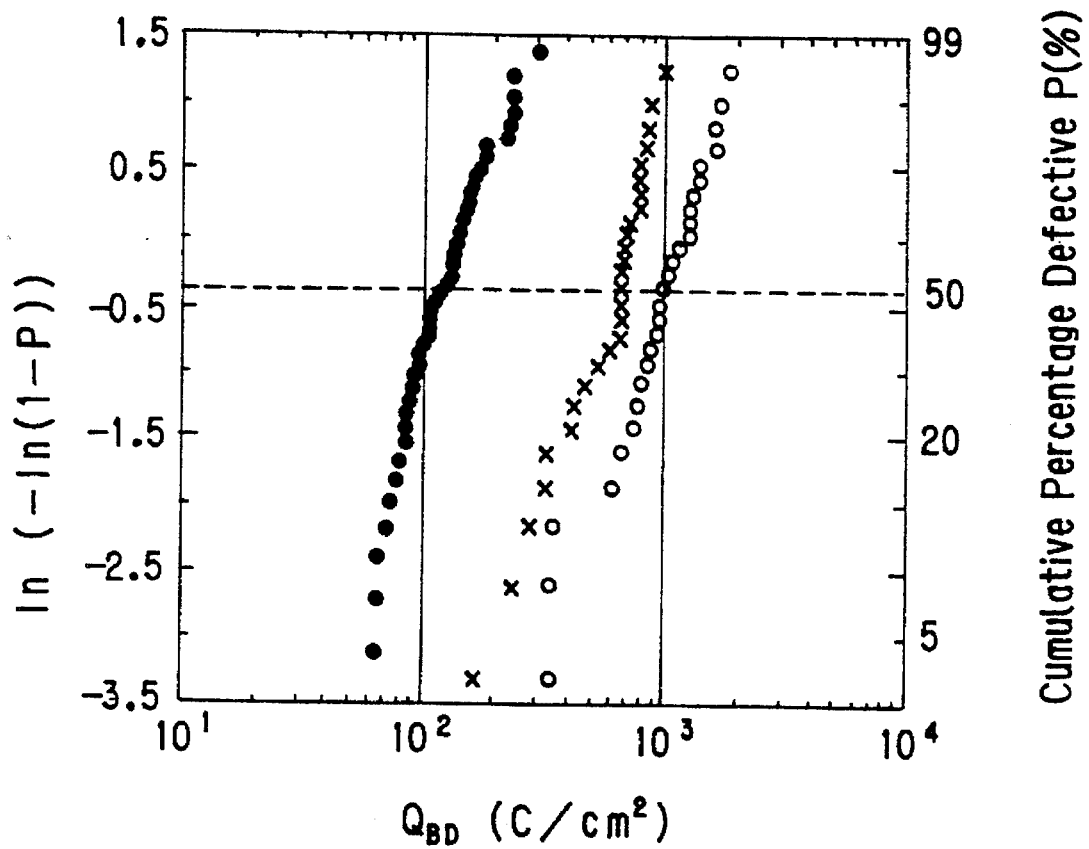
FIG. 3 is a graph showing the results obtained in the evaluation of TDDB characteristics for silicon oxide films obtained in Example 1 and Comparative Example 1.

The TDDB characteristics were evaluated by a method described below. Thirty MOS capacitors were fabricated on a single semiconductor substrate 10. Gate electrodes 14 were each formed on the silicon oxide film (gate dielectric) 12 for an area of 0.1 $mm^2$. Referring to the schematically drawn FIG. 2A, a circuit was fabricated, and a constant stress current J of 0.2 $A/cm^2$ was applied to the gate electrode according to the constant current TDDB evaluation method. The total charge applied to the silicon oxide film 12 until the occurrence of dielectric breakdown $Q_{BD}$ was measured. The graph of FIG. 3 shows the relation between the cumulative failure P and $Q_{BD}$ expressed by Weibull probability distribution. Referring to FIG. 3, the observed values for the samples obtained in Example 1 are plotted with open circles, those for the samples obtained in Example 2 are plotted with crosses, and those for the samples of Comparative Example 1 are plotted with filled circles. The $Q_{BD}$ values at a cumulative 50% failure are given below for comparison.

| | 50% $Q_{BD}$ | |
|---|---|---|
| Example 1 | 1,034.0 | C/cm$^2$ |
| Example 2 | 638.7 | C/cm$^2$ |
| Comp.Example 1 | 126.2 | C/cm$^2$ |

The TDDB represented by $Q_{BD}$ is believed to occur according to the deformation in energy band of a silicon oxide film due to the trapped charge. Thus, $Q_{BD}$ increases with decreasing number of traps in the silicon oxide film or in the boundary between the semiconductor substrate and the silicon oxide film. FIG. 3 clearly reads that the TDDB characteristics of the silicon oxide film (gate dielectric) 12 formed according to Examples 1 and 2 are far superior to those of a silicon oxide film (gate dielectric) obtained according to Comparative Example 1. That is, far improved TDDB characteristics can be obtained on a silicon oxide film subjected to nitriding.

Figure 4A:
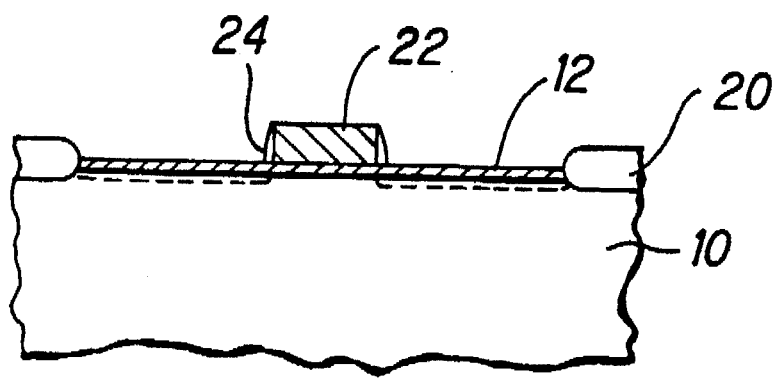
FIGS. 4A and 4B are a diagram showing schematically drawn partial cross sections of a semiconductor substrate and the like, provided as an explanatory means for describing a method for fabricating a MOS transistor.
Figure 4B:
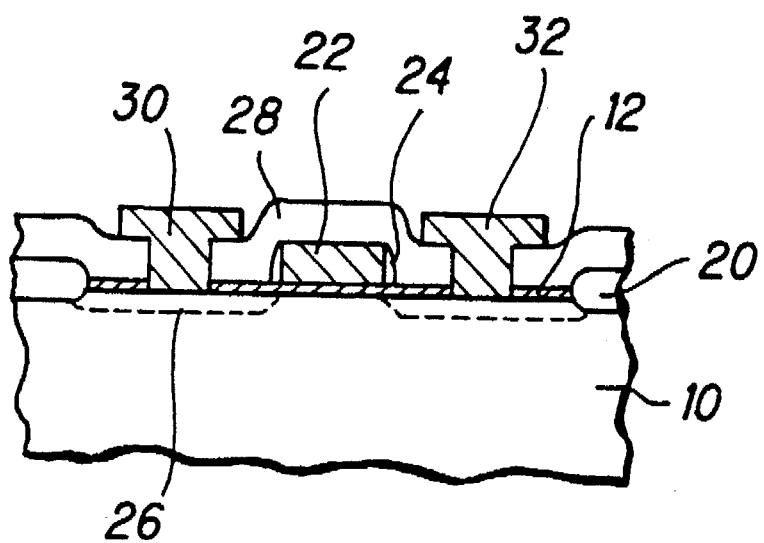

Referring to FIG. 4, the process for fabricating a MOS transistor comprising the method for forming a silicon oxide film according to the present invention is described below. A LOCOS-structured isolation region 20 was formed by a known method on a silicon semiconductor substrate 10 provided as the semiconductor substrate in this case. Then, a silicon oxide film (gate dielectric) 12 was formed on the surface of the semiconductor substrate 10 by the same method employed in Example 1. A polysilicon layer was formed on the entire surface by means of CVD process. The polysilicon layer thus obtained was patterned by means of photolithography and dry etching to form a polysilicon gate electrode 22. Impurities were implanted by ion implantation to implement an LDD (lightly doped drain) structure, and an SiO$_2$ layer was deposited by CVD process to entirely cover the surface of the resulting structure. A gate side-wall 24 was formed on the side wall of the gate electrode 22 by subjecting the resulting SiO$_2$ layer to etch-back (FIG. 4A). Source/drain regions 26 were formed by implanting impurity ions and then activating the implanted impurities by irradiating an energy beam such as a laser radiation or by heat treatment. An insulating layer 28 of SiO$_2$ and the like was formed by means of a conventional CVD process to wholly cover the surface of the resulting structure. An opening 30 was formed in the insulating layer 28 provided on the upper side of the source/drain regions 26 by means of photolithography and dry etching. Then, after depositing a metallic interconnection material such as an Al-1%Si alloy by means of sputtering on the insulating layer 28 inclusive of the inside of the opening 30, the metallic interconnection material on the insulating layer 28 was patterned as desired by using photolithography and dry etching. Thus was formed an interconnection 32. A complete MOS transistor as shown in FIG. 4B was implemented in this manner. The method for forming a silicon oxide film according to the present invention is not only applicable to the fabrication of a gate dielectric for use in MOS transistors, but is also useful in forming, for example, tunnel oxides and the like of flash memories.

The present invention has been described in detail referring to preferred embodiments, but it should be noted that it is not only limited thereto. Wet oxidation can be effected also by utilizing the method of mixing water vapor with a carrier gas such as gaseous oxygen, nitrogen, argon, etc., or by a conventional method of passing dry oxygen through a water bubbler. The conditions for pyrogenic oxidation and for heat treatment described above are provided as examples. Furthermore, the thickness of the oxide film as well as the types of inert gases can be varied and changed as desired. Any halogen element can be used in a desired form.

The silicon oxide film may be a monolayer or may comprise a plurality of layers. In case the silicon oxide film is composed of a plurality of layers, at least the silicon oxide film formed in contact with the surface of the semiconductor substrate is formed by the method according to the present invention. The rest of the layers may be formed by a process selected from the conventional oxidation methods, for instance, dry oxidation inclusive of hydrochloric acid oxidation method, pressurized oxidation, partial pressure oxidation, dilute oxidation, low temperature oxidation, or RTP (oxidation using rapid thermal process).

The silicon oxide film obtained by the method for forming a silicon oxide film according to the present invention comprises performing nitriding, and is far superior in terms of TDDB characteristics as compared with the silicon oxide films formed by conventional wet oxidation methods or by methods proposed in Japanese patent application Hei-6-86836 and Hei 5-287494. Furthermore, the silicon oxide film can be formed according to a conventional wet oxidation method, and yet, the method can be performed under oxidation conditions that are more easily controlled as compared with the hydrochloric acid oxidation method.

While the invention has been described in detail and with reference to specific embodiments thereof, it will be apparent to one skilled in the art that various changes and modifications can be made therein without departing from the spirit and scope thereof.

What is claimed is:

1. A method for forming a silicon oxide film comprising:
    forming a silicon oxide film on a semi-conductor substrate by pyrogenic oxidation;
    furnace annealing the oxide film at a temperature of from about 700° to about 1200° C. for a period of from about 5 to about 60 minutes in an inert gas atmosphere comprising an inert gas selected from the group consisting of nitrogen and argon and about 0.005 to about 10% by volume of the inert gas atmosphere of gaseous hydrogen chloride to provide an annealed film;
    subjecting the annealed film to a nitriding process selected from (a) nitriding in gaseous N$_2$O at about 1000° C. for about 20 seconds or (b) nitriding in gaseous NH$_3$ at about 900° C. for about 60 seconds followed by heat treating in a gaseous N$_2$O or O$_2$ atmosphere, to provide a silicon oxide film which when incorporated into a MOS capacitor exhibits a $Q_{BD}$ at cumulative 50% failure of at least about 638.7 C/cm$^2$.

2. A method for forming a silicon oxide film as claimed in claim 1, wherein the furnace annealing is effected at a temperature in a range of from 700° to 950° C.

3. A method for forming a silicon oxide film as claimed in claim 1, wherein the semiconductor substrate is heated during nitriding by irradiating with infrared radiation.

4. A method for fabricating an insulated gate transistor utilizing a method for forming a silicon oxide film as claimed in claim 1.

* * * * *